US009564529B2

(12) United States Patent
Lee et al.

(10) Patent No.: US 9,564,529 B2
(45) Date of Patent: Feb. 7, 2017

(54) METHOD FOR FABRICATING A STRAINED STRUCTURE AND STRUCTURE FORMED

(71) Applicant: TAIWAN SEMICONDUCTOR MANUFACTURING COMPANY, LTD., Hsinchu (TW)

(72) Inventors: Tsung-Lin Lee, Hsinchu (TW); Chih-Hao Chang, Chu-Bei (TW); Chih-Hsin Ko, Fongshan (TW); Feng Yuan, Yonghe (TW); Jeff J. Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/844,247

(22) Filed: Sep. 3, 2015

(65) Prior Publication Data
US 2015/0380554 A1    Dec. 31, 2015

Related U.S. Application Data

(63) Continuation of application No. 13/910,633, filed on Jun. 5, 2013, now Pat. No. 9,147,594, which is a (Continued)

(51) Int. Cl.
*H01L 29/66* (2006.01)
*H01L 29/78* (2006.01)
(Continued)

(52) U.S. Cl.
CPC ..... *H01L 29/7848* (2013.01); *H01L 21/02532* (2013.01); *H01L 21/02636* (2013.01);
(Continued)

(58) Field of Classification Search
CPC .................. H01L 21/02378; H01L 21/02381;
H01L 21/02524; H01L 21/02532; H01L 21/02573; H01L 21/0245; H01L 21/823807; H01L 29/66636; H01L 29/7848
See application file for complete search history.

(56) References Cited

U.S. PATENT DOCUMENTS 5,581,202 A    12/1996    Yano et al.
5,658,417 A    8/1997    Watanabe et al.
(Continued)

FOREIGN PATENT DOCUMENTS

CN    1945829    4/2007
CN    101179046    5/2008
(Continued)

OTHER PUBLICATIONS

Office Action dated May 2, 2012 from corresponding application No. CN 201010196345.0.
(Continued)

*Primary Examiner* — Thanh Y Tran
(74) *Attorney, Agent, or Firm* — Haynes and Boone, LLP

(57) ABSTRACT

A field effect transistor includes a substrate comprising a fin structure. The field effect transistor further includes an isolation structure in the substrate. The field effect transistor further includes a source/drain (S/D) recess cavity below a top surface of the substrate. The S/D recess cavity is between the fin structure and the isolation structure. The field effect transistor further includes a strained structure in the S/D recess cavity. The strain structure includes a lower portion. The lower portion includes a first strained layer, wherein the first strained layer is in direct contact with the isolation structure, and a dielectric layer, wherein the dielectric layer is in direct contact with the substrate, and the first strained layer is in direct contact with the dielectric layer. The
(Continued)

strained structure further includes an upper portion comprising a second strained layer overlying the first strained layer.

20 Claims, 14 Drawing Sheets

Related U.S. Application Data continuation of application No. 12/775,006, filed on May 6, 2010, now Pat. No. 8,497,528.

(51) Int. Cl.

| | |
|---|---|
| *H01L 21/76* | (2006.01) |
| *H01L 29/165* | (2006.01) |
| *H01L 21/02* | (2006.01) |
| *H01L 21/306* | (2006.01) |
| *H01L 21/31* | (2006.01) |
| *H01L 21/311* | (2006.01) |
| *H01L 29/06* | (2006.01) |
| *H01L 29/08* | (2006.01) |

(52) U.S. Cl.
CPC ........ *H01L 21/30604* (2013.01); *H01L 21/31* (2013.01); *H01L 21/31116* (2013.01); *H01L 21/76* (2013.01); *H01L 29/0653* (2013.01); *H01L 29/0856* (2013.01); *H01L 29/0873* (2013.01); *H01L 29/165* (2013.01); *H01L 29/66795* (2013.01); *H01L 29/785* (2013.01)

(56) References Cited

U.S. PATENT DOCUMENTS

| | | | |
|---|---|---|---|
| 5,767,732 A | 6/1998 | Lee et al. | |
| 5,963,789 A | 10/1999 | Tsuchiaki | |
| 6,065,481 A | 5/2000 | Fayfield et al. | |
| 6,121,786 A | 9/2000 | Yamagami et al. | |
| 6,299,724 B1 | 10/2001 | Fayfield et al. | |
| 6,503,794 B1 | 1/2003 | Watanabe et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,713,365 B2 | 3/2004 | Lin et al. | |
| 6,727,557 B2 | 4/2004 | Takao | |
| 6,740,247 B1 | 5/2004 | Han et al. | |
| 6,743,673 B2 | 6/2004 | Watanabe et al. | |
| 6,762,448 B1 | 7/2004 | Lin et al. | |
| 6,791,155 B1 | 9/2004 | Lo et al. | |
| 6,828,646 B2 | 12/2004 | Marty et al. | |
| 6,830,994 B2 | 12/2004 | Mitsuki et al. | |
| 6,858,478 B2 | 2/2005 | Chau et al. | |
| 6,872,647 B1 | 3/2005 | Yu et al. | |
| 6,940,747 B1 | 9/2005 | Sharma et al. | |
| 6,949,768 B1 | 9/2005 | Anderson et al. | |
| 6,964,832 B2 | 11/2005 | Moniwa et al. | |
| 7,009,273 B2 | 3/2006 | Inoh et al. | |
| 7,018,901 B1 | 3/2006 | Thean et al. | |
| 7,026,232 B1 | 4/2006 | Koontz et al. | |
| 7,067,400 B2 | 6/2006 | Bedell et al. | |
| 7,078,312 B1 | 7/2006 | Sutanto et al. | |
| 7,084,079 B2 | 8/2006 | Conti et al. | |
| 7,084,506 B2 | 8/2006 | Takao | |
| 7,112,495 B2 | 9/2006 | Ko et al. | |
| 7,153,744 B2 | 12/2006 | Chen et al. | |
| 7,157,351 B2 | 1/2007 | Cheng et al. | |
| 7,190,050 B2 | 3/2007 | King et al. | |
| 7,193,399 B2 | 3/2007 | Aikawa | |
| 7,247,887 B2 | 7/2007 | King et al. | |
| 7,265,008 B2 | 9/2007 | King et al. | |
| 7,265,418 B2 | 9/2007 | Yun et al. | |
| 7,297,600 B2 | 11/2007 | Oh et al. | |
| 7,300,837 B2 | 11/2007 | Chen et al. | |
| 7,315,994 B2 | 1/2008 | Aller et al. | |
| 7,323,375 B2 | 1/2008 | Yoon et al. | |
| 7,338,614 B2 | 3/2008 | Martin et al. | |
| 7,351,622 B2 | 4/2008 | Buh et al. | |
| 7,358,166 B2 | 4/2008 | Agnello et al. | |
| 7,361,563 B2 | 4/2008 | Shin et al. | |
| 7,374,986 B2 | 5/2008 | Kim et al. | |
| 7,394,116 B2 | 7/2008 | Kim et al. | |
| 7,396,710 B2 | 7/2008 | Okuno | |
| 7,407,847 B2 | 8/2008 | Doyle et al. | |
| 7,410,844 B2 | 8/2008 | Li et al. | |
| 7,425,740 B2 | 9/2008 | Liu et al. | |
| 7,442,967 B2 | 10/2008 | Ko et al. | |
| 7,456,087 B2 | 11/2008 | Cheng | |
| 7,494,862 B2 | 2/2009 | Doyle et al. | |
| 7,508,031 B2 | 3/2009 | Liu et al. | |
| 7,528,465 B2 | 5/2009 | King et al. | |
| 7,534,689 B2 | 5/2009 | Pal et al. | |
| 7,538,387 B2 | 5/2009 | Tsai | |
| 7,550,332 B2 | 6/2009 | Yang | |
| 7,598,145 B2 | 10/2009 | Damlencourt et al. | |
| 7,605,449 B2 | 10/2009 | Liu et al. | |
| 7,682,911 B2 | 3/2010 | Jang et al. | |
| 7,759,228 B2 | 7/2010 | Sugiyama et al. | |
| 7,795,097 B2 | 9/2010 | Pas | |
| 7,798,332 B1 | 9/2010 | Brunet | |
| 7,820,513 B2 | 10/2010 | Hareland et al. | |
| 7,851,865 B2 | 12/2010 | Anderson et al. | |
| 7,868,317 B2 | 1/2011 | Yu et al. | |
| 7,898,041 B2 | 3/2011 | Radosavljevic et al. | |
| 7,923,321 B2 | 4/2011 | Lai et al. | |
| 7,923,339 B2 | 4/2011 | Meunier-Baillard et al. | |
| 7,960,791 B2 | 6/2011 | Anderson et al. | |
| 7,985,633 B2 | 7/2011 | Cai et al. | |
| 7,989,846 B2 | 8/2011 | Furuta | |
| 7,989,855 B2 | 8/2011 | Narihiro | |
| 8,003,466 B2 | 8/2011 | Shi et al. | |
| 8,043,920 B2 | 10/2011 | Chan et al. | |
| 8,076,189 B2 | 12/2011 | Grant | |
| 8,101,475 B2 | 1/2012 | Oh et al. | |
| 8,497,528 B2 | 7/2013 | Lee et al. | |
| 9,147,594 B2 * | 9/2015 | Lee | H01L 29/66795 |
| 2003/0080361 A1 | 5/2003 | Murthy et al. | |
| 2003/0109086 A1 | 6/2003 | Arao | |
| 2003/0234422 A1 | 12/2003 | Wang et al. | |
| 2004/0075121 A1 | 4/2004 | Yu et al. | |
| 2004/0129998 A1 | 7/2004 | Inoh et al. | |
| 2004/0192067 A1 | 9/2004 | Ghyselen et al. | |
| 2004/0219722 A1 | 11/2004 | Pham et al. | |
| 2004/0259315 A1 | 12/2004 | Sakaguchi et al. | |
| 2005/0020020 A1 | 1/2005 | Collaert et al. | |
| 2005/0051865 A1 | 3/2005 | Lee et al. | |
| 2005/0082616 A1 | 4/2005 | Chen et al. | |
| 2005/0153490 A1 | 7/2005 | Yoon et al. | |
| 2005/0170593 A1 | 8/2005 | Kang et al. | |
| 2005/0212080 A1 | 9/2005 | Wu et al. | |
| 2005/0221591 A1 | 10/2005 | Bedell et al. | |
| 2005/0224800 A1 | 10/2005 | Lindert et al. | |
| 2005/0233598 A1 | 10/2005 | Jung et al. | |
| 2005/0266698 A1 | 12/2005 | Cooney et al. | |
| 2005/0280102 A1 | 12/2005 | Oh et al. | |
| 2006/0038230 A1 | 2/2006 | Ueno et al. | |
| 2006/0068553 A1 | 3/2006 | Thean et al. | |
| 2006/0091481 A1 | 5/2006 | Li et al. | |
| 2006/0091482 A1 | 5/2006 | Kim et al. | |
| 2006/0091937 A1 | 5/2006 | Do | |
| 2006/0105557 A1 | 5/2006 | Klee et al. | |
| 2006/0128071 A1 | 6/2006 | Rankin et al. | |
| 2006/0138572 A1 | 6/2006 | Arikado et al. | |
| 2006/0151808 A1 | 7/2006 | Chen et al. | |
| 2006/0153995 A1 | 7/2006 | Narwankar et al. | |
| 2006/0166475 A1 | 7/2006 | Mantl | |
| 2006/0214212 A1 | 9/2006 | Horita et al. | |
| 2006/0258156 A1 | 11/2006 | Kittl | |
| 2007/0001173 A1 | 1/2007 | Brask et al. | |
| 2007/0004218 A1 | 1/2007 | Lee et al. | |
| 2007/0015334 A1 | 1/2007 | Kittl et al. | |
| 2007/0020827 A1 | 1/2007 | Buh et al. | |
| 2007/0024349 A1 | 2/2007 | Tsukude | |

(56) References Cited

U.S. PATENT DOCUMENTS

| | | |
|---|---|---|
| 2007/0029576 A1 | 2/2007 | Nowak et al. |
| 2007/0048907 A1 | 3/2007 | Lee et al. |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0157119 A1 | 7/2008 | Tsai |
| 2008/0169490 A1 | 7/2008 | Kawai |
| 2008/0185612 A1 | 8/2008 | Fukuda et al. |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0026540 A1 | 1/2009 | Sasaki et al. |
| 2009/0039388 A1 | 2/2009 | Teo et al. |
| 2009/0045411 A1 | 2/2009 | Lin et al. |
| 2009/0066763 A1 | 3/2009 | Fujii et al. |
| 2009/0075029 A1 | 3/2009 | Thomas et al. |
| 2009/0108308 A1 | 4/2009 | Yang et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0242995 A1 | 10/2009 | Suzuki et al. |
| 2009/0273034 A1 | 11/2009 | Woon et al. |
| 2009/0321836 A1 | 12/2009 | Wei et al. |
| 2010/0155790 A1 | 6/2010 | Lin et al. |
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2010/0308379 A1 | 12/2010 | Kuan et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1 | 4/2012 | Tseng et al. |

FOREIGN PATENT DOCUMENTS

| | | |
|---|---|---|
| CN | 101459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007115585 | 10/2007 |

OTHER PUBLICATIONS

Office Action dated May 4, 2012 from corresponding application No. CN 201010243667.6.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Quirk et al., Semiconductor Manufacturing Technology, Oct. 2001, Prentice Hall, Chapter 16.

McVittie, James P., et al., "Speedie: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. KR10-2010-0072103.

OA dated Mar. 27, 2012 from corresponding application No. KR10-2010-0094454.

OA dated Mar. 29, 2012 from corresponding application No. KR10-2010-0090264.

Chui, King-Jien et al., "Source/Drain Germanium Condensation for P-Channel Strained Ultra-Thin Body Transistors", Silicon Nano Device Lab, Dept. of Electrical and Computer Engineering, National University of Singapore, IEEE 2005.

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

\* cited by examiner

METHOD FOR FABRICATING A STRAINED STRUCTURE AND STRUCTURE FORMED

PRIORITY CLAIM

The present application is a continuation of U.S. application Ser. No. 13/910,633, filed Jun. 5, 2013, which is a continuation of U.S. application Ser. No. 12/775,006, filed May 6, 2010, now U.S. Pat. No. 8,497,528, issued Jul. 30, 2013, the disclosures of which are incorporated herein by reference in their entireties.

RELATED APPLICATIONS

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

This disclosure relates to integrated circuit fabrication, and more particularly to a field effect transistor with a strained structure.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin field effect transistor (FinFET). A typical FinFET is fabricated with a thin vertical "fin" (or fin structure) extending from a substrate, for example, etched into a silicon layer of the substrate. The channel of the FinFET is formed in this vertical fin. A gate is provided over (e.g., wrapping) the fin. Having a gate on both sides of the channel allows gate control of the channel from both sides. Further advantages of FinFET comprise reducing the short channel effect and enabling higher current flow.

FIG. 1A shows an isometric view of a conventional FinFET 100, and FIG. 1B illustrates a cross-sectional view of the FinFET 100 taken along the line a-a of FIG. 1A. The fin 104/108 comprises a raised active region 104 above a semiconductor substrate 102. Fin 104/108 is surrounded by a shallow trench isolation (STI) structure 106. A gate structure 110 comprising a gate dielectric 112, a gate electrode 114, and an optional hardmask layer 116 is formed above the fin 104/108. Sidewall spacers 118 are formed on both sides of the gate structure 110. Further, a portion of the fin 104/108 contains strained structures 108 in source and drain (S/D) recess cavities of the FinFET 100. The strained structures 108 are formed after a fin recessing process and an epitaxial growth step. The strained structures 108 utilizing epitaxial silicon germanium (SiGe) may be used to enhance carrier mobility.

However, there are challenges to implement such features and processes in complementary metal-oxide-semiconductor (CMOS) fabrication. As the gate length and spacing between devices decrease, these problems are exacerbated. For example, an ordered atomic arrangement does not exist due to lattice mismatch between the portion 104 of the fin 104/108 and strained portions 108. Thus, strain-induced crystal defects 108a may become embedded in the strained structure 108. The crystal defects 108a may provide carrier transportation paths during device operation, thereby increasing the likelihood of device instability and/or device failure.

Accordingly, what are needed are methods for fabricating a reduced-defect strained structure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1A:
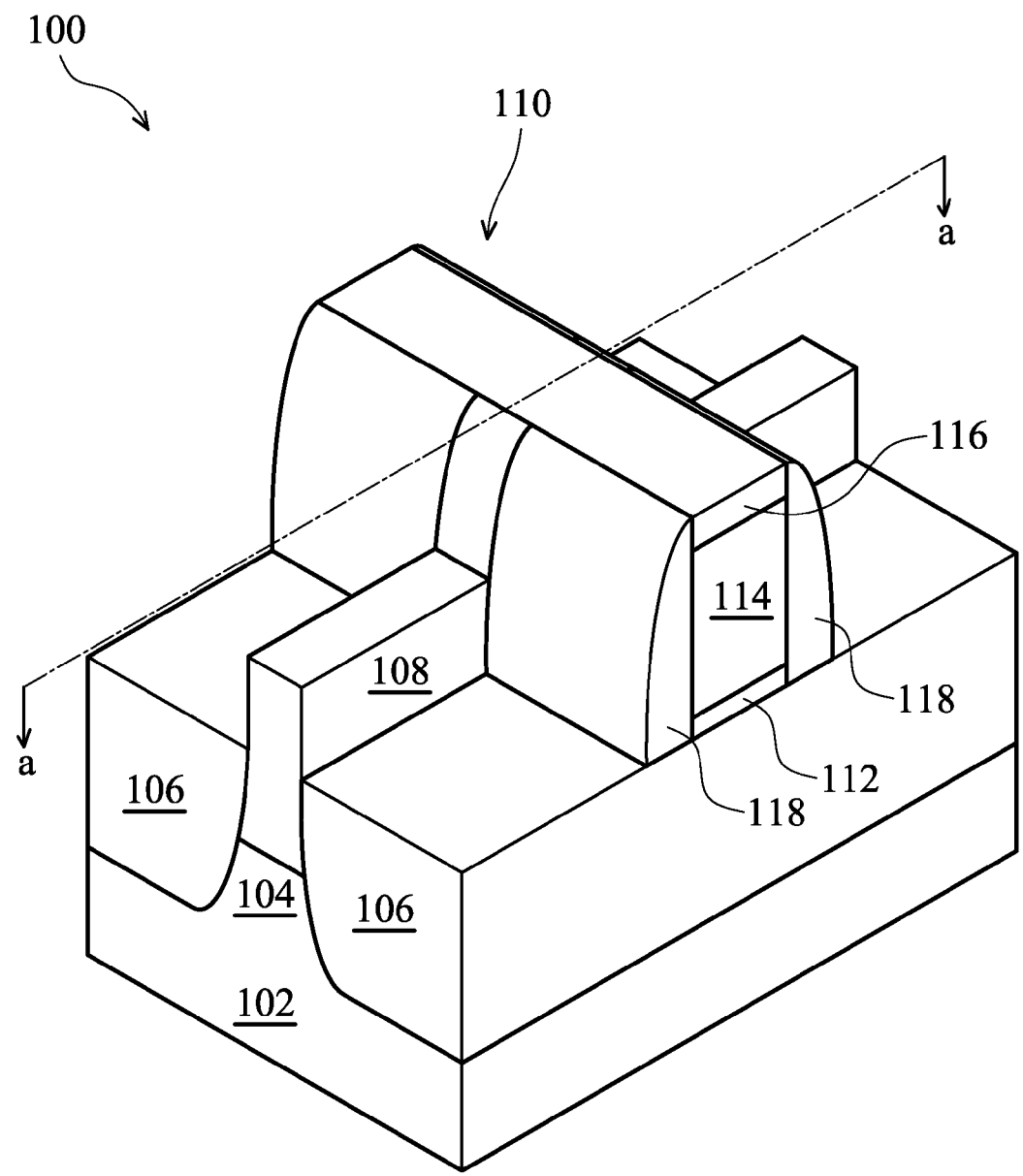
FIG. 1A shows an isometric view of a conventional FinFET.
Figure 1B:
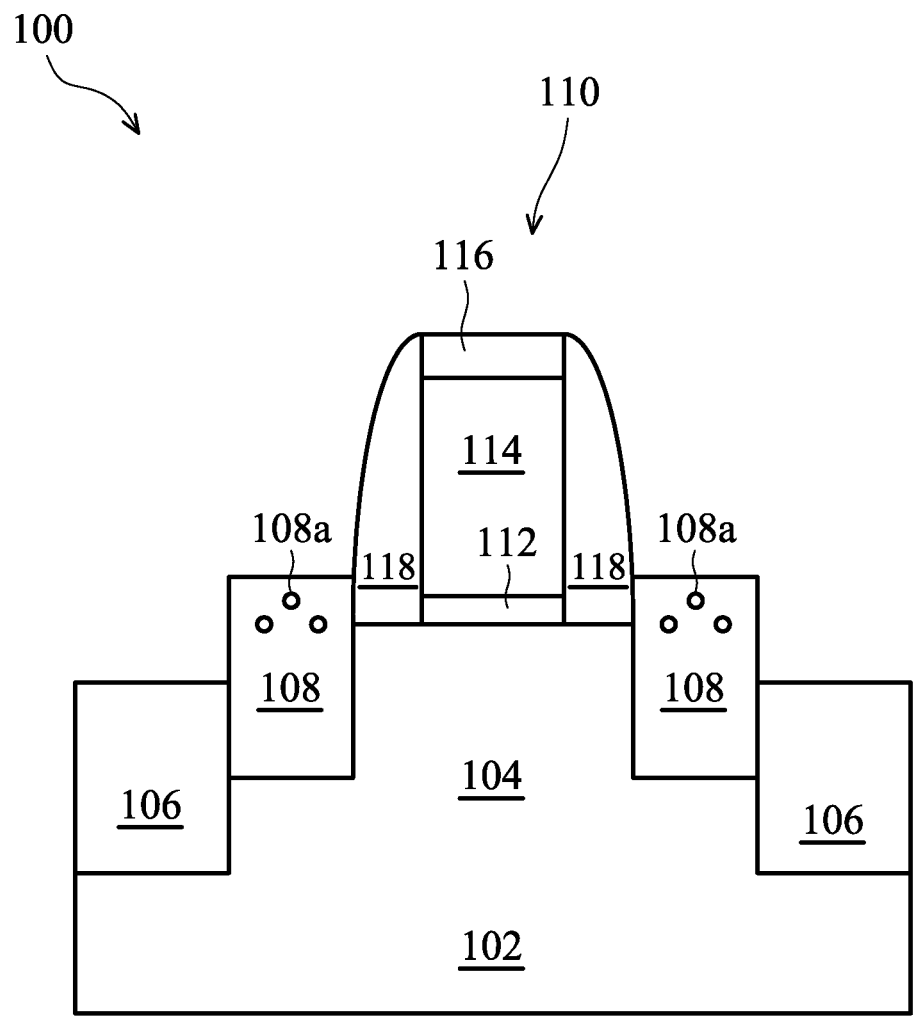
FIG. 1B illustrates a cross-sectional view of the FinFET taken along the line a-a of FIG. 1A.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
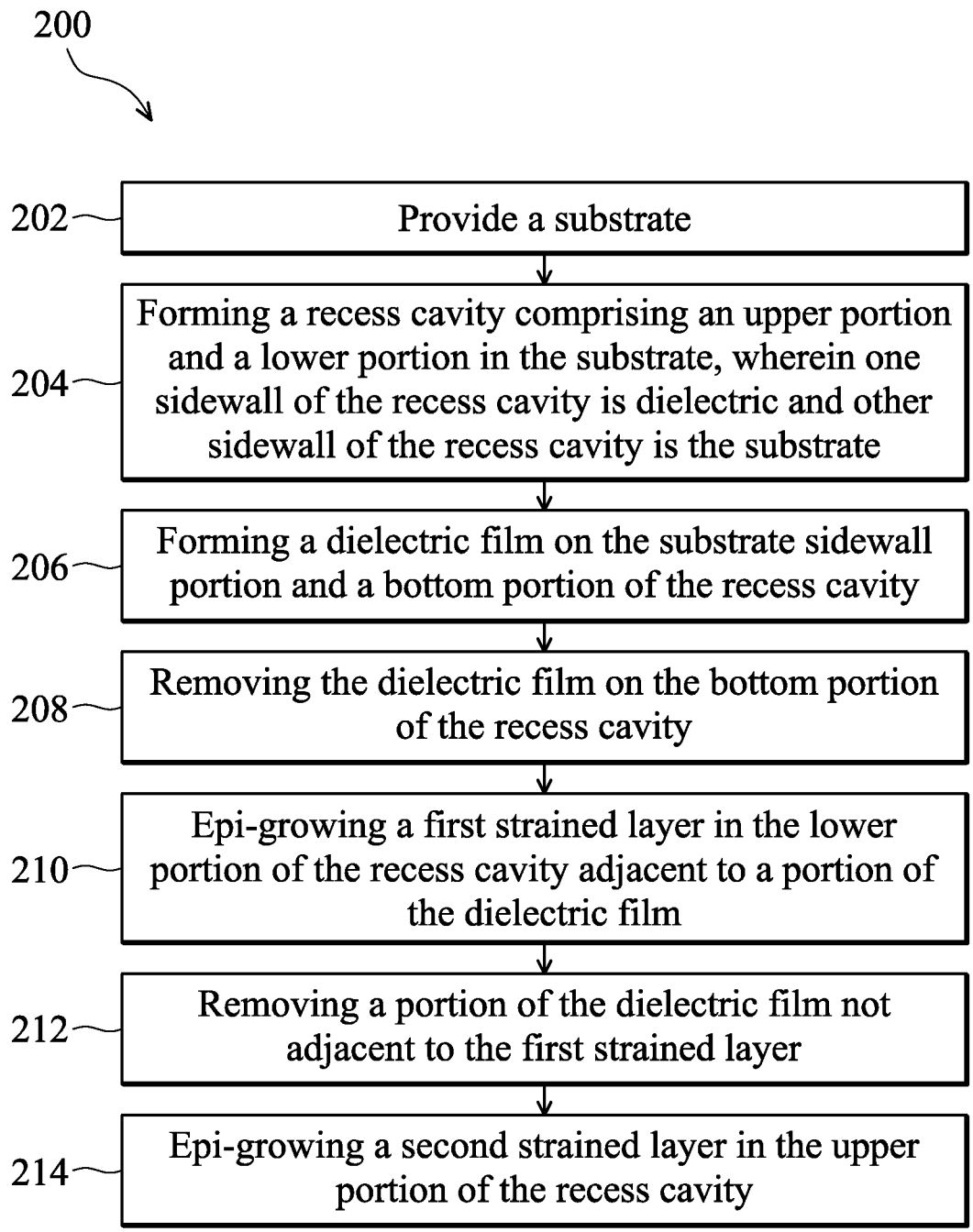
FIG. 2 is a flowchart illustrating a method for fabricating strained structures according to various aspects of the present disclosure.

Referring to FIG. 2, illustrated is a flowchart of a method 200 for fabricating a semiconductor device according to various aspects of the present disclosure. The method 200 begins with block 202 in which a substrate is provided. The method 200 continues with block 204 in which a recess cavity comprising an upper portion and a lower portion may be formed in the substrate, wherein one sidewall of the recess cavity is dielectric and other sidewall of the recess cavity is the substrate. The method 200 continues with block 206 in which a dielectric film may be formed on the substrate sidewall portion and a bottom portion of the recess cavity. The method 200 continues with block 208 in which removing the dielectric film may include removing the dielectric film on the bottom portion of the recess cavity. The method 200 continues with block 210 in which epi-growing a first strained layer may be epi-grown in the lower portion of the recess cavity adjacent to a portion of the dielectric film. The method 200 continues with block 212 in which a portion of the dielectric film not adjacent to the first strained layer may be removed. The method 200 continues with block 214 in which a second strained layer may be epi-grown in the upper portion of the recess cavity. The discussion that follows illustrates various embodiments of semiconductor devices that can be fabricated according to the method 200 of FIG. 2.

Referring to FIGS. 3A-3F and 4A-4E, illustrated are schematic cross-sectional views of strained structures 308, 408 (in FIGS. 3F and 4E) of semiconductor devices 300, 400 at various stages of fabrication according to various aspects of the present disclosure. As employed in the present disclosure, the term semiconductor devices 300, 400 refer to a FinFET. The FinFET refers to any fin-based, multi-gate transistor. The semiconductor devices 300, 400 may be included in a microprocessor, memory cell, and/or other integrated circuit (IC). It is noted that the method of FIG. 2 does not produce completed semiconductor devices 300, 400. Completed semiconductor devices 300, 400 may be fabricated using complementary metal-oxide-semiconductor (CMOS) technology processing. Accordingly, it is understood that additional processes may be provided before, during, and after the method 200 of FIG. 2, and that some other processes may only be briefly described herein. Also, FIGS. 2 through 4E are simplified for a better understanding of the present disclosure. For example, although the figures illustrate the semiconductor devices 300, 400, it is understood the IC may comprise a number of other devices comprising resistors, capacitors, inductors, fuses, etc.

Figure 3A:
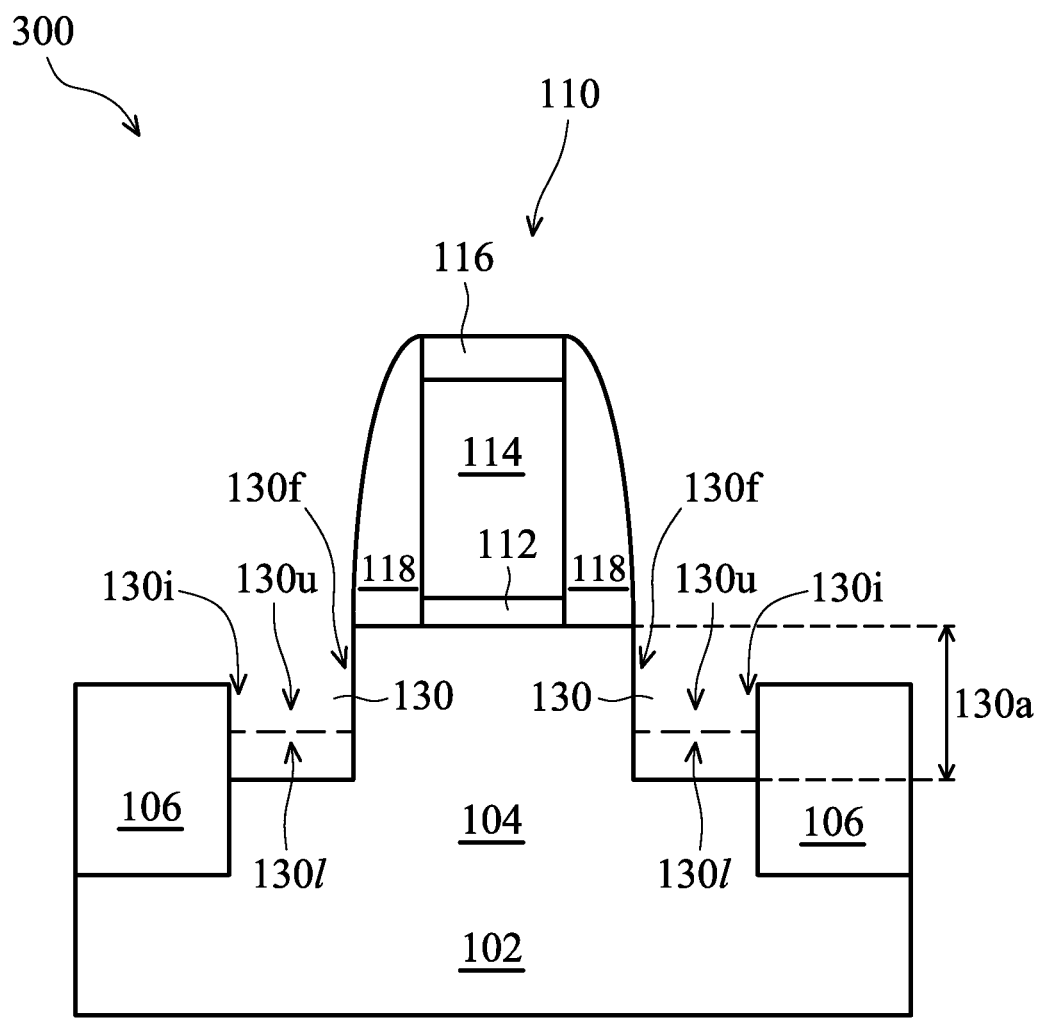
FIGS. 3A-F show schematic cross-sectional views of a FinFET comprising a strained structure at various stages of fabrication according to various aspects of the present disclosure.

Referring to FIG. 3A, a substrate 102 is provided having a fin structure 104. In one embodiment, the substrate 102 comprises a crystalline silicon substrate (e.g., wafer). The substrate 102 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

The substrate 102 may alternatively be made of some other suitable elementary semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 102 may include an epitaxial layer (epi-layer), may be strained for performance enhancement, and/or may include a silicon-on-insulator (SOI) structure.

The fin structure 104, formed over the substrate 102, comprises one or more fins. In the present embodiment, for simplicity, the fin structure 104 comprises a single fin. The fin comprises any suitable material, for example, the fin structure 104 comprises silicon. The fin structure 104 may further comprise a capping layer disposed on the fin, which may be a silicon-capping layer.

The fin structure 104 is formed using any suitable process comprising various deposition, photolithography, and/or etching processes. An exemplary photolithography process may include forming a photoresist layer (resist) overlying the substrate 102 (e.g., on a silicon layer), exposing the resist to a pattern, performing a post-exposure bake process, and developing the resist to form a masking element including the resist. The masking element may then be used to etch the fin structure 104 into the silicon layer. The fin structure 104 may be etched using reactive ion etching (RIE) processes and/or other suitable processes. In an example, the silicon fin 104 is formed by using patterning and etching of a portion of the silicon substrate 102. In another example, silicon fins of the fin structure 104 may be formed by using patterning and etching of a silicon layer deposited overlying an insulator layer (for example, an upper silicon layer of a silicon-insulator-silicon stack of an SOI substrate).

Isolation structure 106 may be formed on the substrate 102 to isolate the various doped regions. The isolation structure 106 may utilize isolation technology, such as local oxidation of silicon (LOCOS) or shallow trench isolation (STI), to define and electrically isolate the various doped regions. In the present embodiment, the isolation structure 106 includes a STI. The isolation structure 106 may comprise silicon oxide, silicon nitride, silicon oxynitride, fluoride-doped silicate glass (FSG), a low-K dielectric material, and/or combinations thereof. The isolation structure 106, and in the present embodiment, the STI, may be formed by any suitable process. As one example, the formation of the STI may include patterning the semiconductor substrate 102 by a conventional photolithography process, etching a trench in the substrate 102 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 3A, a gate stack 110 is formed over the substrate 102 and over a portion of the fin structure 104. The gate stack 110 typically comprises a gate dielectric layer 112 and a gate electrode layer 114. The gate stack 110 may be formed using any suitable process, including the processes described herein.

In one example, the gate dielectric layer 112 and gate electrode layer 114 are sequentially deposited on the substrate 102 and over a portion of the fin structure 104. In some embodiments, the gate dielectric layer 112 may include silicon oxide, silicon nitride, silicon oxy-nitride, or high-k dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 112 is a high-k dielectric layer with a thickness in the range of about 10 to 30 angstroms. The gate dielectric layer 112 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 112 may further comprise an interfacial layer (not shown) to reduce damage between the gate dielectric layer 112 and the fin structure 104. The interfacial layer may comprise silicon oxide.

In some embodiments, the gate electrode layer 114 may comprise a single layer or multilayer structure. In the present embodiment, the gate electrode layer 114 may comprise poly-silicon. Further, the gate electrode layer 114 may be doped poly-silicon with uniform or non-uniform doping. Alternatively, the gate electrode layer 114 may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 114 comprises a thickness in the range of about 30 nm to about 60 nm. The gate electrode layer 114 may be formed using a suitable process such as ALD, CVD, PVD, plating, or combinations thereof.

Then, a layer of photoresist is formed over the gate stack 110 by a suitable process, such as spin-on coating, and patterned to form a patterned photoresist feature by a proper lithography patterning method. In one embodiment, a width of the patterned photoresist feature is in the range of about 15 to 45 nm. The patterned photoresist feature can then be transferred using a dry etching process to the underlying layers (i.e., the gate electrode layer 114 and the gate dielectric layer 112) to form the gate stack 110. The photoresist layer may be stripped thereafter.

In another example, a hard mask layer 116 is formed over the gate stack 110; a patterned photoresist layer is formed on the hard mask layer 116; the pattern of the photoresist layer is transferred to the hard mask layer 116 and then transferred to the gate electrode layer 114 and the gate dielectric layer 112 to form the gate stack 110. The hard mask layer 116 comprises silicon oxide. Alternatively, the hard mask layer 116 may optionally comprise silicon nitride, silicon oxynitride, and/or other suitable dielectric materials, and may be formed using a method such as CVD or PVD. The hard mask layer 116 has a thickness in the range from about 100 to 800 angstroms.

Still referring to FIG. 3A, the semiconductor device 300 further comprises a dielectric layer 118 formed over the substrate 102 and the gate stack 110. The dielectric layer 118 may include silicon oxide, silicon nitride, silicon oxy-nitride, or other suitable material. The dielectric layer 118 may comprise a single layer or multilayer structure. The dielectric layer 118 may be formed by CVD, PVD, ALD, or other suitable technique. The dielectric layer 118 comprises a thickness ranging from about 5 to 15 nm. Then, an anisotropic etching is performed on the dielectric layer 118 to form a pair of spacers 118 on two sides of the gate stack 110.

Still referring to FIG. 3A, other portions of the fin structure 104 (i.e., portions other than where the gate stack 110 and spacers 118 are formed thereover) are recessed to form source and drain (S/D) recess cavities 130 below a top surface of the substrate 102 disposed between the gate stack 110 and the isolation structure 106. In one embodiment, using the pair of spacers 118 as hard masks, a biased etching process is performed to recess a top surface of the fin structure 104 that are unprotected or exposed to form the S/D recess cavities 130. In an embodiment, the etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or Cl2 as etch gases. Also, in the embodiments provided, the bias voltage used in the etching process may be tuned to allow better control of an etching direction to achieve desired profiles for the S/D recess cavities 130. The recess cavity 130 may comprise an upper portion 130$u$ and a lower portion 130$l$ separated by the dotted line in FIG. 3A. One sidewall 130$i$ of the recess cavity 130 is dielectric and other sidewall 130$f$ of the recess cavity 130 is the substrate 102. In one embodiment, a ratio of a height of the upper portion 130$u$ to a height of the lower portion 130$l$ may be from 0.8 to 1.2. In some embodiments, a height 130$a$ between the top surface of the substrate 102 and a bottom of the S/D recess cavity 130 is in the range of about 300 to 2000 nm.

Figure 3B:
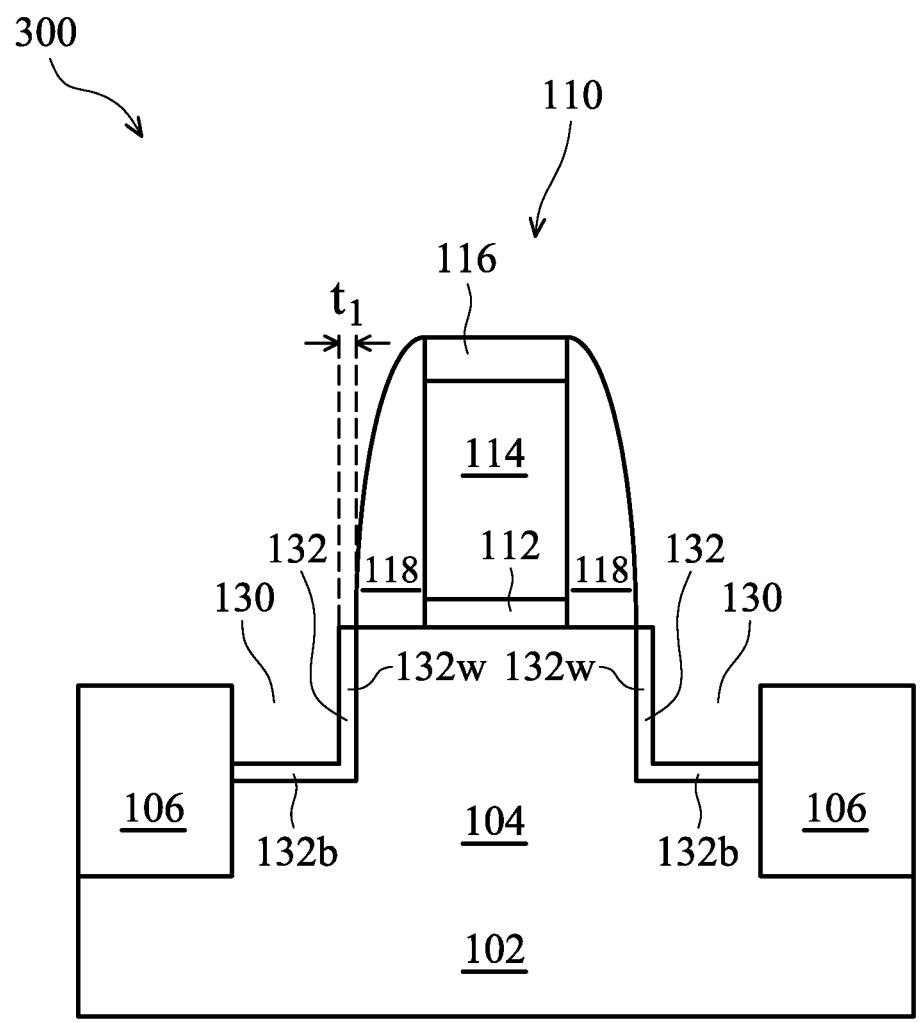

Referring to FIG. 3B, following formation of the recess cavity 130, a dielectric film 132 may be formed along the substrate surface of the recess cavity 130. The dielectric film 132 comprises a sidewall portion 132$w$ and a bottom portion 132$b$. The dielectric film 132 may be formed of silicon oxide or silicon oxynitride grown using a thermal oxidation process. For example, the dielectric film 132 can be grown by a rapid thermal oxidation (RTO) process or in a conventional annealing process, which includes oxygen or NO$_2$. A thickness $t_1$ of the dielectric film 132 may be in the range of about 20 to 100 angstroms.

Figure 3C:
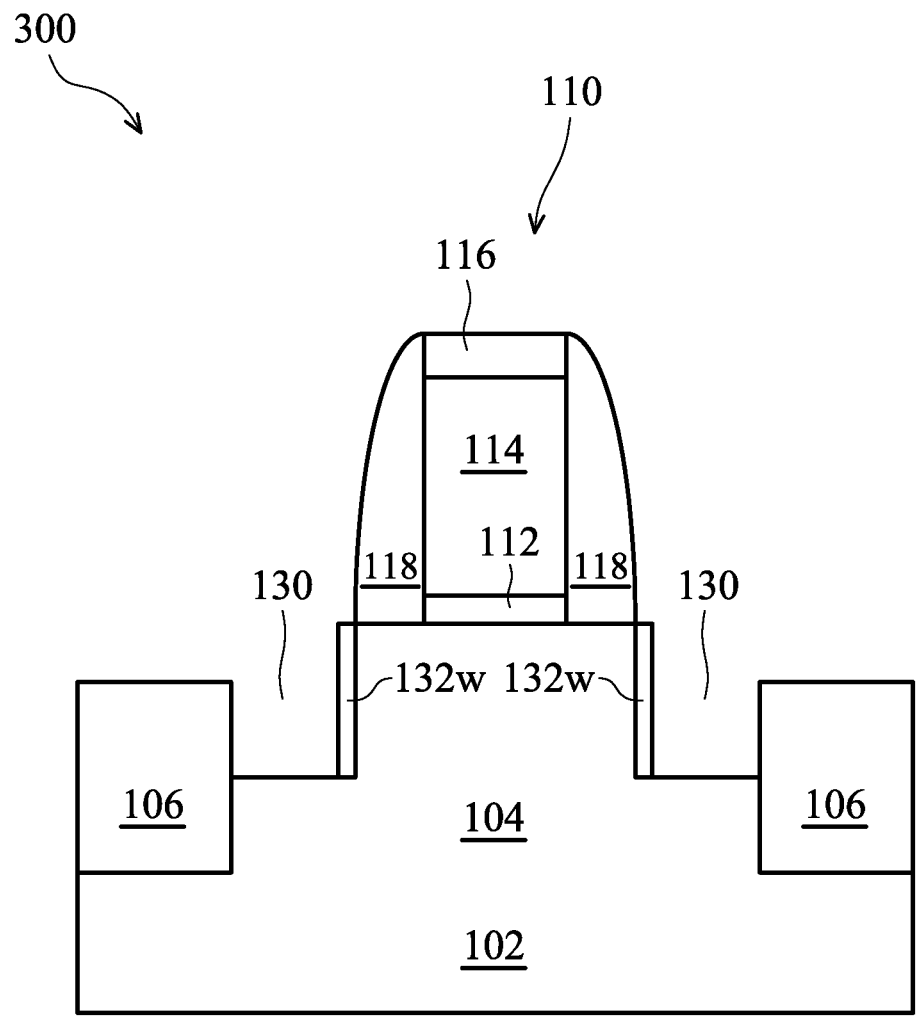

Referring to FIG. 3C, subsequent to the formation of the dielectric film 132, a dry etching process is performed to remove the bottom portion 132$b$ of the dielectric film 132, whereby the sidewall portion 132$w$ of the dielectric film 132 is not removed. For example, the dry etching process may be a plasma etch process performed under a source power of about 120 to 160 W, and a pressure of about 450 to 550 mTorr, using BF3, H2, and Ar as etching gases.

Figure 3D:
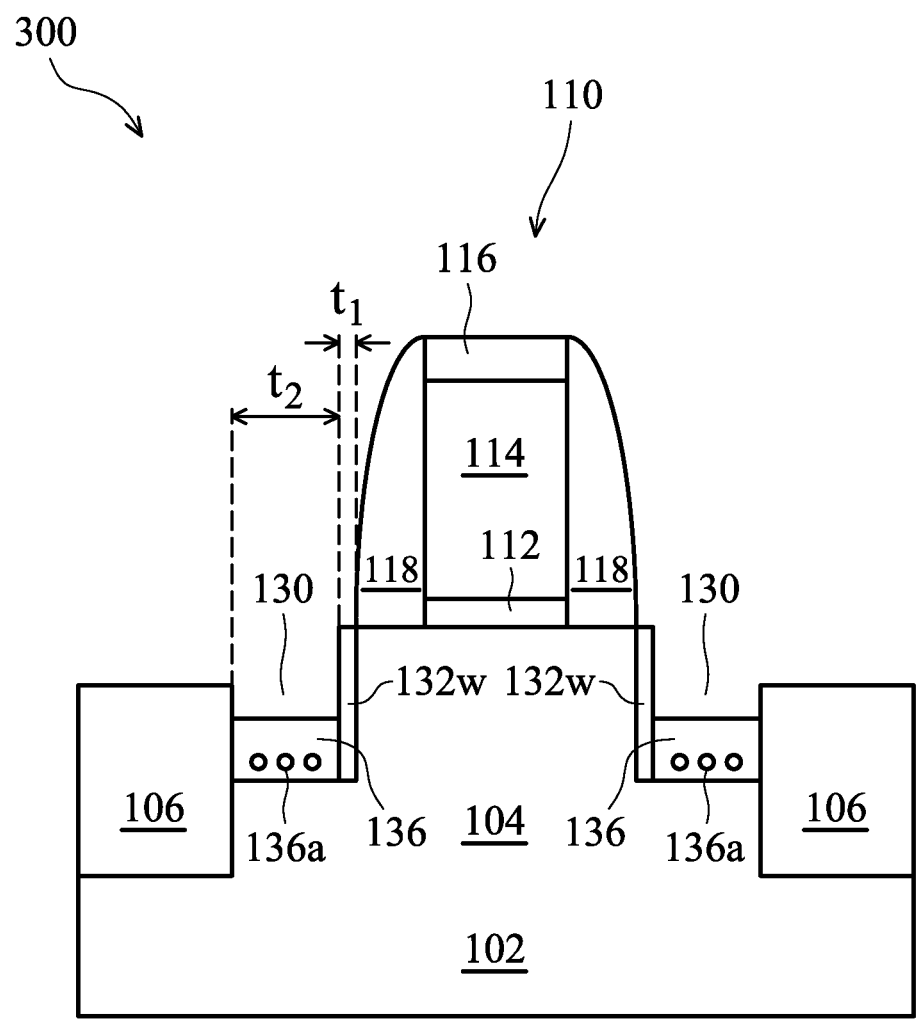

Referring to FIG. 3D, after the bottom portion 132$b$ of the dielectric film 132 is removed, a first strained layer 136 is epi-grown in the lower portion 130$l$ of the recess cavities 130 adjacent to a portion of the dielectric film 132. In one embodiment, a first strained layer 136 comprising silicon germanium (SiGe) is epi-grown by a low-pressure chemical vapor deposition (LPCVD) process. The first strained layer 136 may serve as a relaxation layer and trap defects 136$a$ to eliminate crystal defects in a second strained layer 138

(shown in FIG. 3F) in the source and drain regions of the n-type FinFET. The LPCVD process is performed at a temperature of about 400 to 800° C. and under a pressure of about 1 to 200 Torr, using SiH$_4$ and GeH$_4$ as reaction gases. In another embodiment, a first strained layer 136 comprising silicon carbon (SiC) is epi-grown by a LPCVD process. The first strained layer 136 may serve as a relaxation layer and trap defects 136a to eliminate crystal defects in a second strained layer 138 (shown in FIG. 3F) in the source and drain regions of the p-type FinFET. The LPCVD process is performed at a temperature of about 400 to 800° C. and under a pressure of about 1 to 200 Torr, using SiH$_4$ and CH$_4$ as reaction gases. A thickness $t_2$ of the first strained layer 136 may be in the range of about 15 to 45 nm. The thickness $t_1$ of the dielectric film 132 is less than the thickness $t_2$ of the first strained layer 136.

Figure 3E:
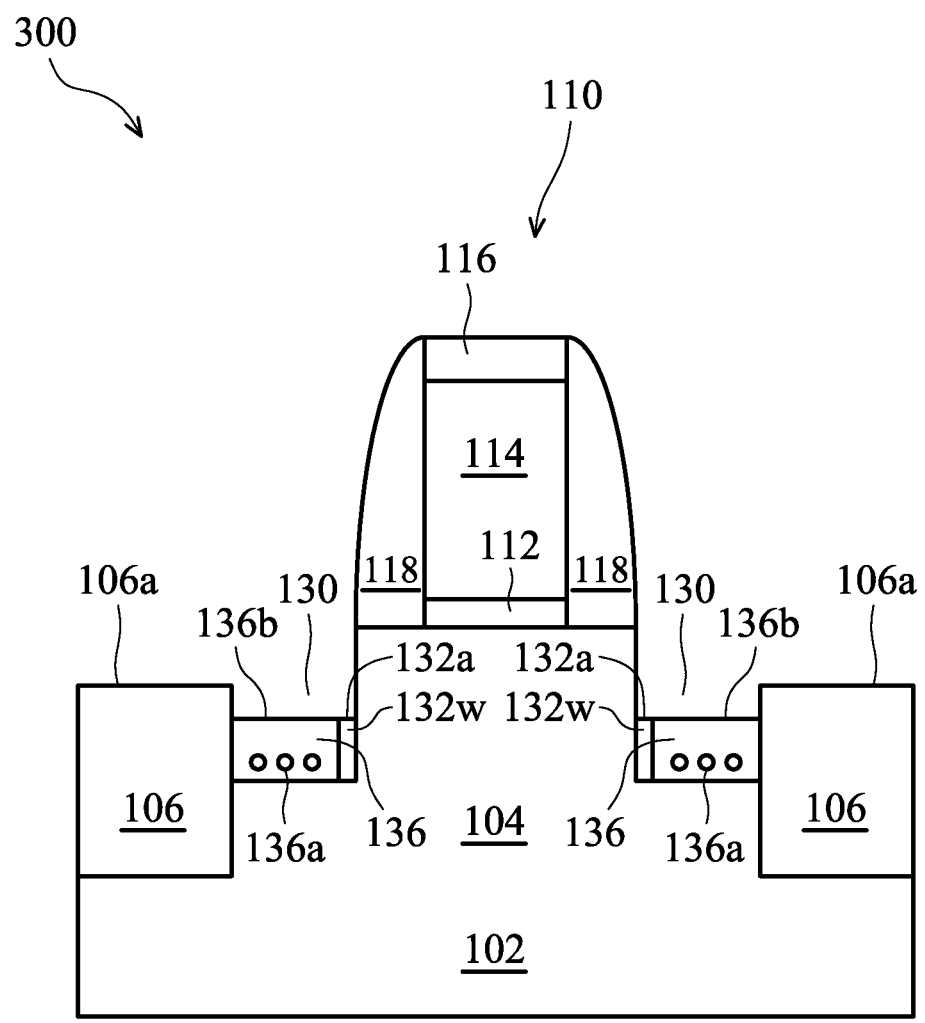

Referring to FIG. 3E, subsequent to the formation of the first strained layer 136, a top portion of the sidewall portion 132w of the dielectric film 132 not adjacent to the first strained layer 136 has been removed using a wet etching process, for example, by dipping the substrate 102 in hydrofluoric acid (HF), exposing a top surface 132a of the remaining sidewall portion 132w of the dielectric film 132. Because the wet etching process has higher etch selectivity for oxide than to silicon, SiGe, and SiC, the etch process removes the dielectric film 132 faster than the fin structure 104 and the first strained layer 136.

In the present embodiment, the first strained layer 136 is disposed between the isolation structure 106 and the remaining sidewall portion 132w of the dielectric film 132. In an embodiment, a top surface 136b of the first strained layer 136 and the top surface 132a of the remaining sidewall portion 132w of the dielectric film 132 are substantially aligned. In another embodiment, the top surface 136b of the first strained layer 136 and the top surface 132a of the remaining sidewall portion 132w of the dielectric film 132 are below a top surface 106a of the isolation structure 106.

Figure 3F:
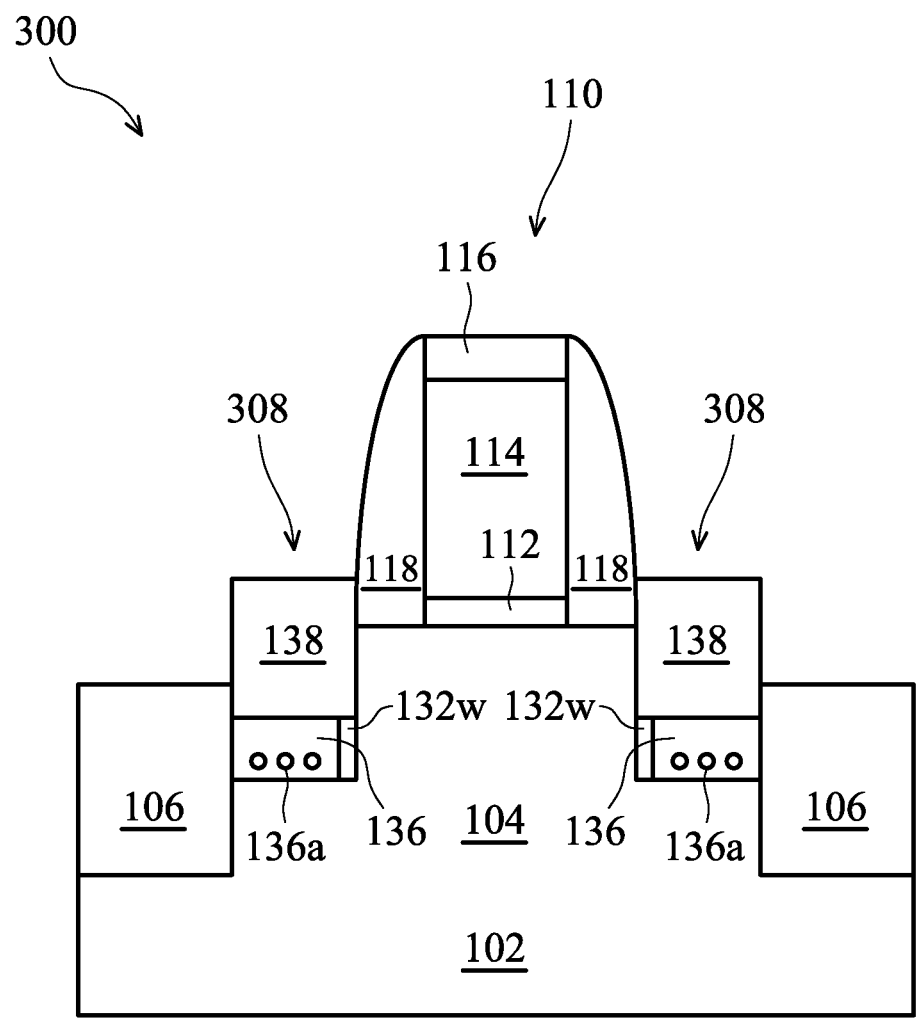

Referring to FIG. 3F, after the top portion of the sidewall portion 132w of the dielectric film 132 is removed, a second strained layer 138 overlying the first strained layer 136 and remaining sidewall portion 132w of the dielectric film 132 is epi-grown in the upper portion 130u of the recess cavities 130 in the fin structure 104. Further, the first strained layer 136, remaining sidewall portion 132w of the dielectric film 132, and second strained layer 138 are collectively hereinafter referred to as a strained structure 308. It should be noted that the first strained layer 136 serves as a relaxation layer and may trap defects 136a to eliminate crystal defects in the second strained layer 138. Crystal defects in the second strained layer 138 may provide carrier transportation paths during device operation, thereby increasing the likelihood of device instability and/or device failure. Accordingly, the above method of fabricating a semiconductor device 300 may form a reduced-defect strained structure 308 to enhance carrier mobility and upgrade the device performance.

In one embodiment, the second strained layer 138, such as silicon carbide (SiC), is epi-grown by a LPCVD process to form the source and drain regions of the n-type FinFET. An example the LPCVD process for the growth of SiC is performed at a temperature of about 400 to 800° C. and under a pressure of about 1 to 200 Torr, using SiH$_4$ and CH$_4$ as reaction gases. In another embodiment, the second strained layer 138, such as silicon germanium (SiGe), is epi-grown by a LPCVD process to form the source and drain regions of the p-type FinFET. The LPCVD process is performed at a temperature of about 400 to 800° C. and under a pressure of about 1 to 200 Torr, using SiH$_4$ and GeH$_4$ as reaction gases. In still another embodiment, the second strained layer 138, such as silicon, is epi-grown by a LPCVD process to form the source and drain regions of both the p-type FinFET and n-type FinFET. The LPCVD process is performed at a temperature of about 400 to 800° C. and under a pressure of about 1 to 200 Torr, using SiH$_4$ as a reaction gas.

Figure 4A:
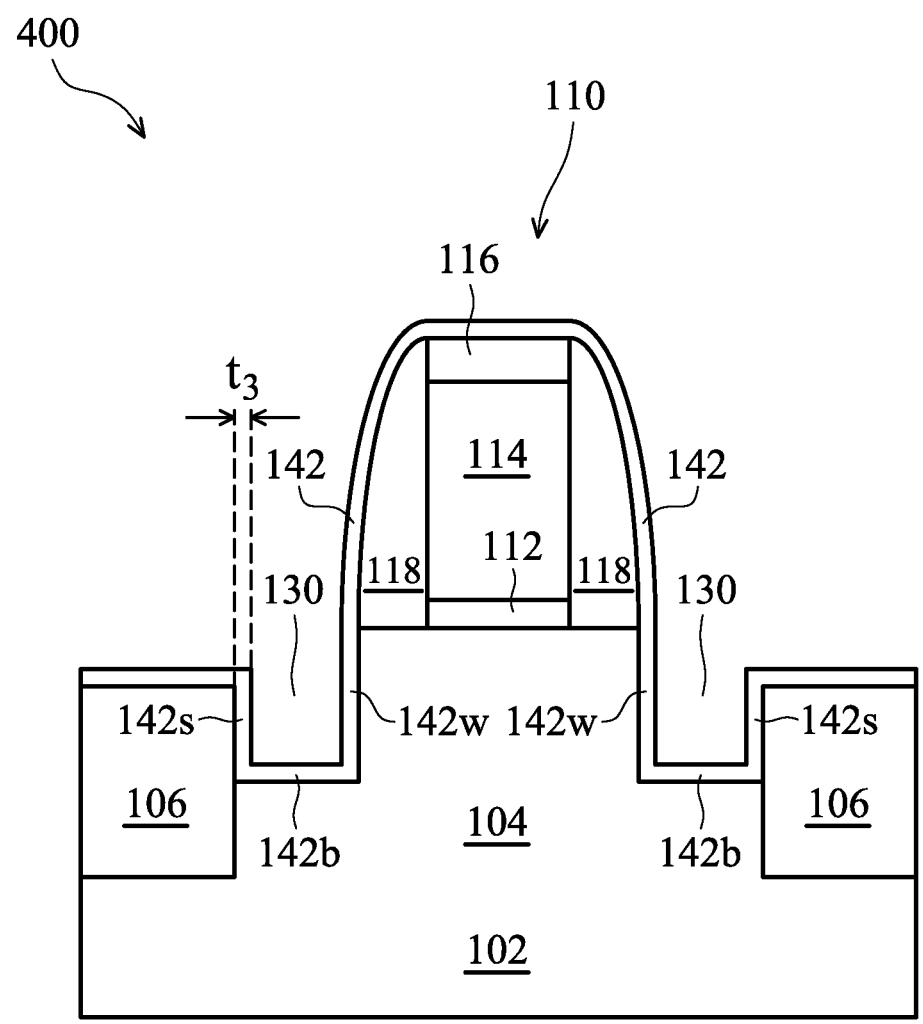
FIGS. 4A-E show schematic cross-sectional views of a FinFET comprising a strained structure at various stages of fabrication according to various aspects of the present disclosure.

Alternatively, FIG. 4A shows the substrate 102 of FIG. 3A after deposition of a dielectric film 142 by a CVD process. The dielectric film 142 formed by CVD will deposit over all exposed surfaces, and thus may be formed on the isolation structure 106, hard mask layer 116, spacers 118, and recess cavities 130. The dielectric film 142 may comprise a first sidewall portion 142w, a second sidewall portion 142s, and a bottom portion 142b. The dielectric film 142 may be formed of silicon oxide or silicon oxynitride deposited using a CVD process. For example, the dielectric film 142 can be deposited under a pressure less than 10 mTorr and a temperature of about 350° C. to 500° C., using SiH$_4$ and N$_2$O as reacting precursors. A thickness $t_3$ of the dielectric film 142 may be in the range of about 20 to 100 angstroms.

Figure 4B:
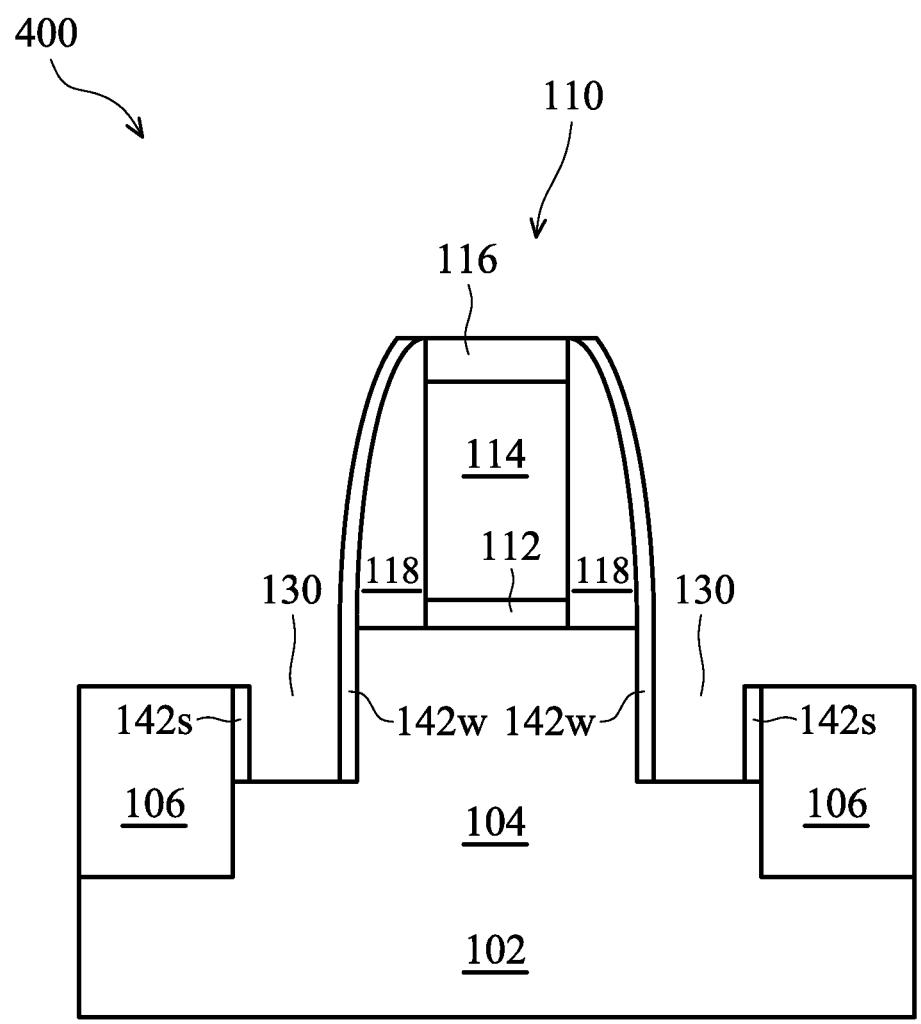

Referring to FIG. 4B, subsequent to the formation of the dielectric film 142, a dry etching process is performed to remove the bottom portion 142b of the dielectric film 142, whereby the first sidewall portion 142w and second sidewall portion 142s of the dielectric film 142 are not removed. For example, the dry etching process may be performed under a source power of about 120 to 160 W, and a pressure of about 450 to 550 mTorr, using BF3, H2, and Ar as etching gases.

Figure 4C:
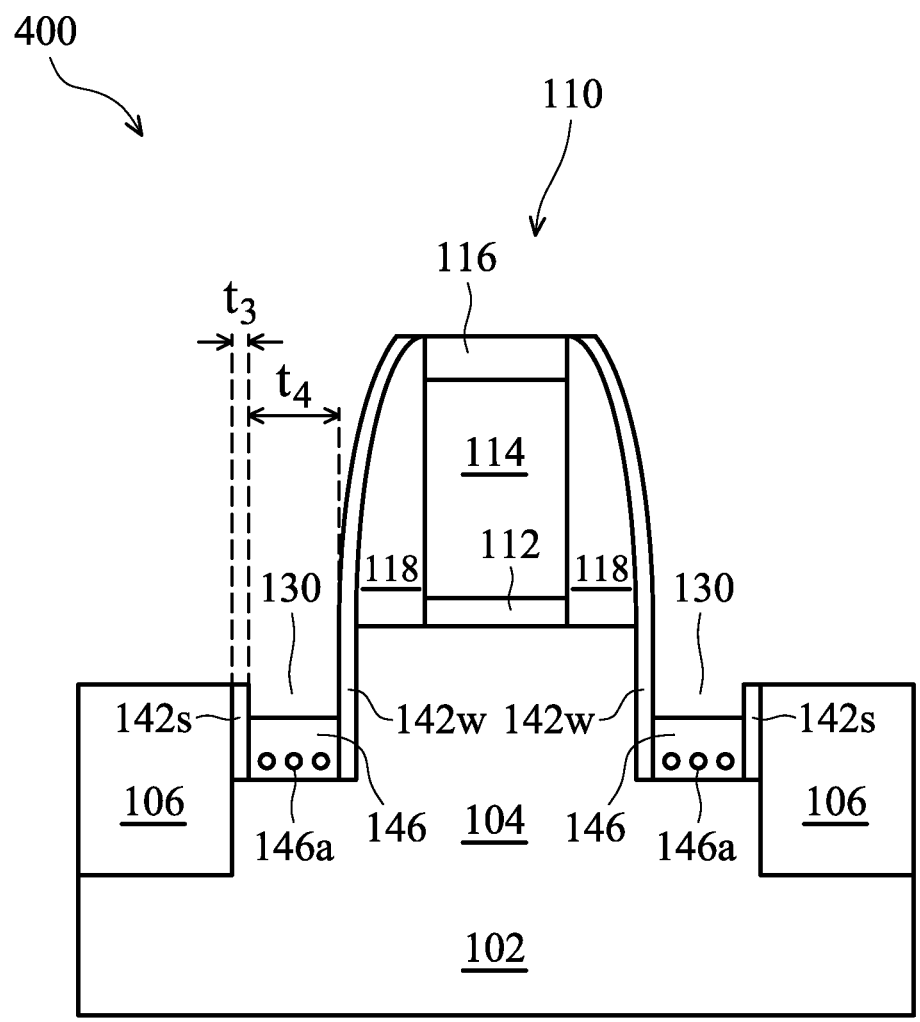

Referring to FIG. 4C, after the bottom portion 142b of the dielectric film 142 removing process, a first strained layer 146 is epi-grown in the lower portion 130l of the recess cavities 130 adjacent to a portion of the dielectric film 142. In one embodiment, a first strained layer 146 comprising silicon germanium (SiGe) is epi-grown by a LPCVD process. The first strained layer 146 may serve as a relaxation layer and trap defects 146a to eliminate crystal defects in a second strained layer 148 (shown in FIG. 4E) in the source and drain regions of the n-type FinFET. The LPCVD process is performed at a temperature of about 400 to 800° C. and under a pressure of about 1 to 200 Torr, using SiH$_4$ and GeH$_4$ as reaction gases. In another embodiment, a first strained layer 146 comprising silicon carbide (SiC) is epi-grown by a LPCVD process. The first strained layer 146 may serve as a relaxation layer and trap defects 146a to eliminate crystal defects in the second strained layer 148 (shown in FIG. 4E) in the source and drain regions of the p-type FinFET. In one embodiment, LPCVD process for SiC deposition is performed at a temperature of about 400 to 800° C. and under a pressure of about 1 to 200 Torr, using SiH$_4$ and CH$_4$ as reaction gases. A thickness $t_4$ of the first strained layer 146 may be in the range of about 12 to 40 nm. The thickness $t_3$ of the dielectric film 142 is less than the thickness $t_4$ of the first strained layer 146.

Figure 4D:
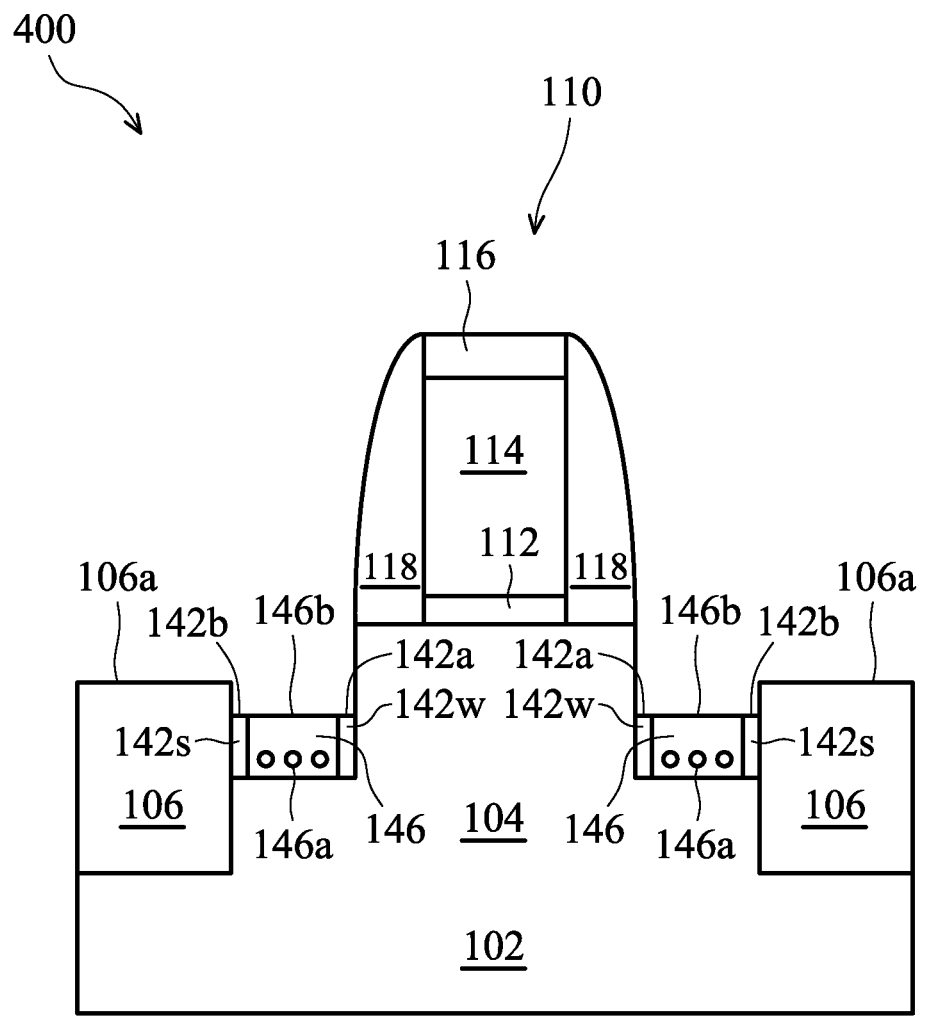

Referring to FIG. 4D, subsequent to the formation of the first strained layer 146, top portions of the first and second sidewall portions 142w, 142s of the dielectric film 142 not adjacent to the first strained layer 146 are removed using a wet etching process, for example, by dipping the substrate 102 in hydrofluoric acid (HF), exposing top surfaces 142a, 142b of the remaining first and second sidewall portions 142w, 142s of the dielectric film 142. Because the wet etching process preferentially etches oxide over silicon, SiGe, and SiC, the etch process removes the dielectric film 142 faster than the fin structure 104 and the first strained layer 146.

In the present embodiment, the first strained layer 146 is disposed between the isolation structure 106 and the remaining first sidewall portion 142w of the dielectric film 142. Further, the remaining second sidewall portion 142s of dielectric film 142 is between the first strained layer 146 and the isolation structure 106. In an embodiment, a top surface 146b of the first strained layer 146 and the top surfaces 142a, 142b of the remaining first and second sidewall portions 142w, 142s of the dielectric film 142 are substantially aligned. In another embodiment, the top surface 146b of the first strained layer 136 and the top surfaces 142a, 142b of the remaining first and second sidewall portions 142w, 142s of the dielectric film 142 are below the top surface 106a of the isolation structure 106.

Figure 4E:
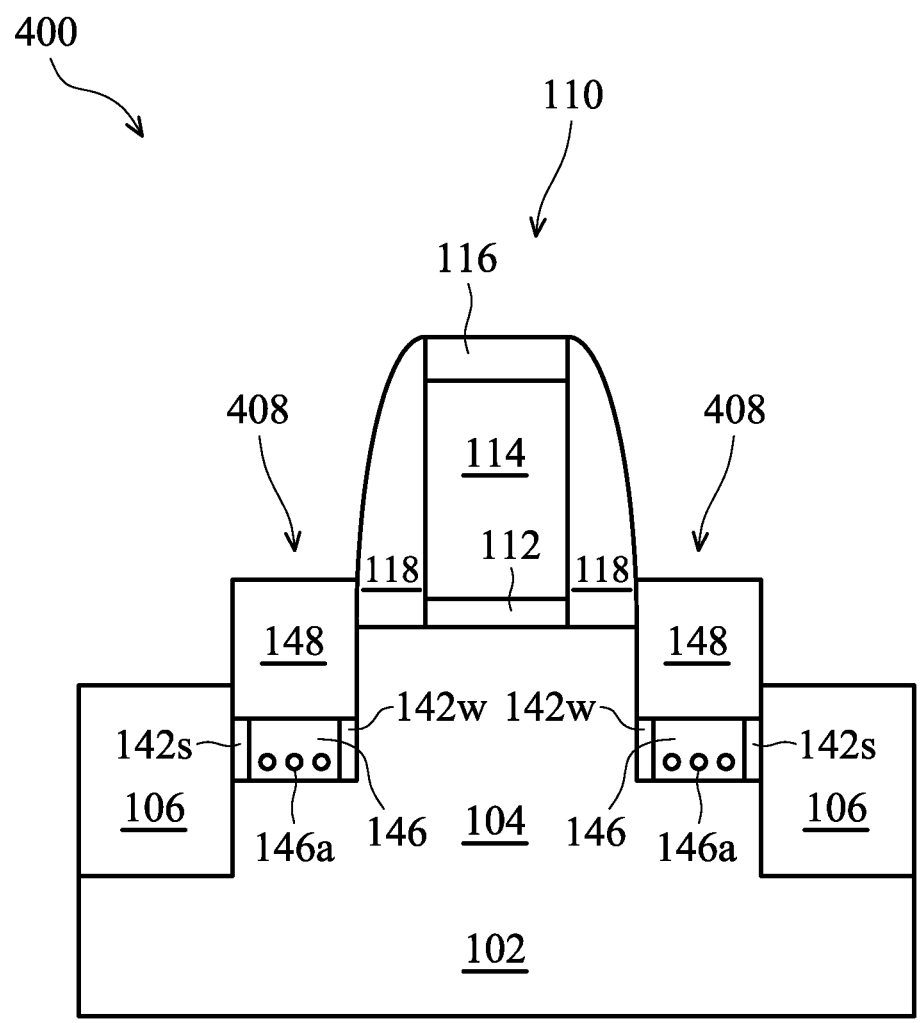

Referring to FIG. 4E, after the top portions of the first and second sidewall portions 142w, 142s of the dielectric film 142 are removed, a second strained layer 148 overlying the first strained layer 146 and remaining first and second sidewall portions 142w, 142s of the dielectric film 142 is epi-grown in the upper portion 130u of the recess cavities 130. Further, the first strained layer 146, remaining first sidewall portion 142w and second sidewall portion 142w of the dielectric film 142, and second strained layer 148 are collectively hereinafter referred to as a strained structure 408. It should be noted that the first strained layer 146 serves as a relaxation layer and may trap defects 146a to eliminate crystal defects in the second strained layer 148. Crystal defects in the second strained layer 148 may provide carrier transportation paths during device operation, thereby increasing the likelihood of device instability and/or device failure. Accordingly, the above method of fabricating a semiconductor device 400 may form a reduced-defect strained structure 408 to enhance carrier mobility and upgrade the device performance.

In one embodiment a second strained layer 148 comprising silicon carbide (SiC) is epi-grown by a LPCVD process to form the source and drain regions of the n-type FinFET. The LPCVD process is performed at a temperature of about 400 to 800° C. and under a pressure of about 1 to 200 Torr, using $SiH_4$ and $CH_4$ as reaction gases. In another embodiment a second strained layer 148 comprising silicon germanium (SiGe) is epi-grown by a LPCVD process to form the source and drain regions of the p-type FinFET. The LPCVD process is performed at a temperature of about 400 to 800° C. and under a pressure of about 1 to 200 Torr, using $SiH_4$ and $GeH_4$ as reaction gases. In still another embodiment a second strained layer 148 comprising silicon is epi-grown by a LPCVD process to form the source and drain regions of both the p-type FinFET and n-type FinFET. The LPCVD process is performed at a temperature of about 400 to 800° C. and under a pressure of about 1 to 200 Torr, using $SiH_4$ as a reaction gas.

After the steps shown in FIGS. 2, 3 and 4 have been performed, subsequent processes, comprising silicidation and interconnect processing, are typically performed to complete the semiconductor device 300 and 400 fabrication.

One aspect of this description relates to a field effect transistor. The field effect transistor includes a substrate comprising a fin structure. The field effect transistor further includes an isolation structure in the substrate. The field effect transistor further includes a source/drain (S/D) recess cavity below a top surface of the substrate. The S/D recess cavity is between the fin structure and the isolation structure. The field effect transistor further includes a strained structure in the S/D recess cavity. The strain structure includes a lower portion. The lower portion includes a first strained layer, wherein the first strained layer is in direct contact with the isolation structure, and a dielectric layer, wherein the dielectric layer is in direct contact with the substrate, and the first strained layer is in direct contact with the dielectric layer. The strained structure further includes an upper portion comprising a second strained layer overlying the first strained layer.

Another aspect of this description relates to a method for fabricating a semiconductor device. The method includes forming a recess cavity comprising an upper portion and a lower portion in a substrate, wherein the recess cavity includes a sidewall defined by an isolation structure. The method further includes forming a dielectric film on a bottom portion and a sidewall of the recess cavity opposite the isolation structure. The method further includes removing the dielectric film on the bottom portion of the recess cavity. The method further includes forming a first strained layer in the lower portion of the recess cavity in direct contact with the dielectric film, wherein the first strained layer is between the dielectric film and the isolation structure. The method further includes forming a second strained layer over the first strained layer in the upper portion of the recess cavity.

Still another aspect of this description relates to a field effect transistor. The field effect transistor includes an isolation structure in a substrate. The field effect transistor further includes a source/drain (S/D) recess cavity below a top surface of the substrate, wherein a sidewall of the S/D recess cavity is defined by the isolation structure. The field effect transistor further includes a strained structure in the S/D recess cavity. The strain structure includes a lower portion. The lower portion includes a defect trapping layer, wherein the first defect trapping layer is in direct contact with the isolation structure, and a dielectric layer, wherein the dielectric layer is in direct contact with the substrate, and the defect trapping layer is in direct contact with the dielectric layer. The strained structure further includes an upper portion comprising a strained layer overlying the defect trapping layer.

While the preferred embodiments have been described by way of example, it is to be understood that the disclosure is not limited to the disclosed embodiments. To the contrary, it is intended to cover various modifications and similar arrangements (as would be apparent to those skilled in the art). Therefore, the scope of the disclosure should be accorded the broadest interpretation so as to encompass all such modifications and similar arrangements. The disclosure can be used to form or fabricate a strained structure for a semiconductor device. In this way, a strained structure having no defect in a semiconductor device is fabricated.

What is claimed is:

1. A field effect transistor comprising:
   a substrate comprising a fin structure;
   an isolation structure in the substrate; a source/drain (S/D) recess cavity below a top surface of the substrate, wherein the S/D recess cavity is between the fin structure and the isolation structure; and
   a strained structure in the S/D recess cavity, wherein the strain structure comprises:
      a lower portion, the lower portion comprising:
         a first strained layer, wherein the first strained layer is in direct contact with the isolation structure, and
         a dielectric layer, wherein the dielectric layer is in direct contact with the substrate, and the first strained layer is in direct contact with the dielectric layer; and
      an upper portion comprising a second strained layer overlying the first strained layer.

2. The field effect transistor of claim 1, wherein a width of the S/D recess cavity is substantially constant.

3. The field effect transistor of claim 1, wherein the first strained layer comprises trapped defects.

4. The field effect transistor of claim 1, wherein the second strained layer extends over a top surface of the dielectric layer.

5. The field effect transistor of claim 1, wherein a material of the first strained layer is different from a material of the second strained layer.

6. The field effect transistor of claim 1, wherein the second strained layer is in direct contact with the substrate and in direct contact with the isolation structure.

7. The field effect transistor of claim 1, wherein a height of the dielectric layer is substantially equal to a height of the first strained layer.

8. The field effect transistor of claim 1, wherein a top surface of the second strained layer extends above a top surface of the isolation structure.

9. The field effect transistor of claim 1, wherein the second strained layer includes fewer defects than the first strained layer.

10. A method of fabricating a semiconductor device, the method comprising:
    forming a recess cavity comprising an upper portion and a lower portion in a substrate, wherein the recess cavity includes a sidewall defined by an isolation structure;
    forming a dielectric film on a bottom portion and a sidewall of the recess cavity opposite the isolation structure;
    removing the dielectric film on the bottom portion of the recess cavity;
    forming a first strained layer in the lower portion of the recess cavity in direct contact with the dielectric film, wherein the first strained layer is between the dielectric film and the isolation structure, wherein forming the first strained layer comprises growing the first strained layer in direct contact with the isolation structure; and
    forming a second strained layer over the first strained layer in the upper portion of the recess cavity.

11. The method of claim 10, wherein forming the first strained layer comprises trapping defects within the first strained layer.

12. The method of claim 10, wherein forming the second strained layer comprises growing the second strained layer over the first strained layer, and the first strained layer and the second strained layer comprise a same material.

13. The method of claim 12, wherein growing the second strained layer comprises growing the second strained layer having fewer defects than the first strained layer.

14. The method of claim 10, wherein forming the second strained layer comprises forming the second strained layer over a top surface of the dielectric layer.

15. The method of claim 10, further comprising etching the dielectric layer to expose a portion of the sidewall of the recess cavity opposite the isolation structure.

16. The method of claim 15, wherein etching the dielectric layer is performed sequentially with removing the dielectric film on the bottom portion of the recess cavity.

17. The method of claim 15, wherein etching the dielectric layer comprises reducing a height of the dielectric layer to be substantially equal to a height of the first strained layer.

18. The method of claim 10, wherein the sidewall of the recess cavity opposite the isolation structure is formed of semiconductor material, and
    wherein forming the dielectric film on the sidewall of the recess cavity opposite the isolation structure includes forming the dielectric film directly on the semiconductor material.

19. A field effect transistor comprising:
    an isolation structure in a substrate;
    a source/drain (S/D) recess cavity below a top surface of the substrate, wherein a sidewall of the S/D recess cavity is defined by the isolation structure; and
    a strained structure in the S/D recess cavity, wherein the strain structure comprises:
        a lower portion, the lower portion comprising:
            a defect trapping layer, wherein the defect trapping layer is in direct contact with the isolation structure, and
            a dielectric layer, wherein the dielectric layer is in direct contact with the substrate, and the defect trapping layer is in direct contact with the dielectric layer; and
        an upper portion comprising a strained layer overlying the defect trapping layer.

20. The field effect transistor of claim 19, wherein the strained layer comprises fewer defects than the defect trapping layer.

* * * * *